United States Patent
Nagatomo et al.

(10) Patent No.: US 7,130,546 B2
(45) Date of Patent: Oct. 31, 2006

(54) OPTICAL RECEIVER

(75) Inventors: Koji Nagatomo, Fukuoka (JP); Satoshi Yamamoto, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 603 days.

(21) Appl. No.: 10/123,688

(22) Filed: Apr. 16, 2002

(65) Prior Publication Data
US 2004/0208652 A1    Oct. 21, 2004

(30) Foreign Application Priority Data
Dec. 11, 2001    (JP) ............................ 2001-377260

(51) Int. Cl.
*H04B 10/06*    (2006.01)
(52) U.S. Cl. .................. 398/210; 398/202; 398/208; 398/209; 398/214; 359/337; 359/341
(58) Field of Classification Search ............. 398/198, 398/202, 208, 209, 210, 214; 198/209; 359/341, 359/337; 330/29; 325/42
See application file for complete search history.

(56) References Cited

U.S. PATENT DOCUMENTS

| | | | |
|---|---|---|---|
| 3,848,194 A * | 11/1974 | Nishimura et al. | 330/281 |
| 4,565,974 A | 1/1986 | Smoot | |
| 5,293,405 A * | 3/1994 | Gersbach et al. | 375/232 |
| 5,479,424 A * | 12/1995 | Sakuyama | 372/26 |
| 5,729,373 A | 3/1998 | Sakuyama | |
| 5,841,571 A * | 11/1998 | Terahara | 359/341.41 |
| 6,057,951 A * | 5/2000 | Sugawara | 398/209 |

FOREIGN PATENT DOCUMENTS

| | | |
|---|---|---|
| JP | 53-133478 | 11/1978 |
| JP | 8-265258 | 10/1996 |
| JP | 9-18408 | 1/1997 |
| JP | 11-346194 | 12/1999 |
| WO | WO 01/028135 | 4/2000 |

OTHER PUBLICATIONS

Japanese Office Action dated May 30, 2006 for corresponding Japanese application 2001-377260.

* cited by examiner

*Primary Examiner*—Hanh Phan
(74) *Attorney, Agent, or Firm*—Katten Muchin Rosenman LLP

(57) ABSTRACT

An optical receiver controls the amplitude of a light signal at a constant level so as to be constant for improvements in the quality of signal regeneration and reliability. A modulation part modulates the amplitude of the light signal. An opto-electric conversion part converts the output signal of the modulation part into an electric signal. A gain varying part amplifies the electric signal. A control part controls the gain of the gain varying part so that a variation width of the envelope line after signal amplification becomes close to a given value. A regeneration part compares the signal after amplification with a given threshold value for signal decision.

8 Claims, 15 Drawing Sheets

OPTICAL RECEIVER

BACKGROUND OF THE INVENTION

1. Field of the Invention

The present invention relates to an optical receiver receiving a light signal.

2. Description of the Related Art

The time of multimedia including the Internet has come. An optical communication network technique of backbone communication systems is desired to realize advanced services and broadband, and is actively developed toward information society. As the optical communication has a larger capacity and a higher rate, a receiver part in an optical transmission system is required to have further advanced receiving functions.

FIG. 15 is a view of a primary structure of the optical receiver. An optical receiver 100 is made up of an optical amplifier 101, a light receiving element 102, an amplifier 103, and a signal regeneration part 104.

The optical amplifier 101 receives a light signal transferred over an optical fiber cable, and amplifies it. The light receiving element 102 converts the amplified light signal into an electric signal, which is then amplified by the amplifier 103. The signal regeneration part 104 makes a decision as to the signal is "1" or "0" based on a fixed threshold so that the original signal can be regenerated.

However, the optical receiver 100 has the following disadvantages. The amplitude of the electric signal after the opto-electric conversion does not have a constant level but varies. The signal regeneration part 104 regenerates the original signal from the electric signal having the amplitude that varies by using a fixed optimal threshold level for decision making. The fixed threshold level is not always optimal to decision making on the amplitude-varying signal. This may result in errors in signal regeneration and degrades the quality of transmission and reliability.

The amplitude of the electric signal may be varied due to variation in the waveform of the input light signal, and variation in the opto-electric conversion efficiency resulting from the temperature dependence of the light-receiving element 102 and the amplifier 103.

SUMMARY OF THE INVENTION

Taking the above into consideration, an object of the present invention is to provide an optical receiver in which the amplitude of a target signal that is applied to a signal regeneration part and is compared with a given reference level is constant or the average amplitude is constant.

To accomplish the above object, according to the present invention, there is provided an optical receiver comprising: a modulation part modulating a light signal received; an opto-electric conversion part converting an output signal of the modulation part into an electric signal; a gain varying part amplifying the electric signal; a control part controlling a gain of the gain varying part so that a variation width of an envelope line of the signal after amplification becomes close to a given value; and a regeneration part comparing the signal after the amplification with a given threshold level for signal decision.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
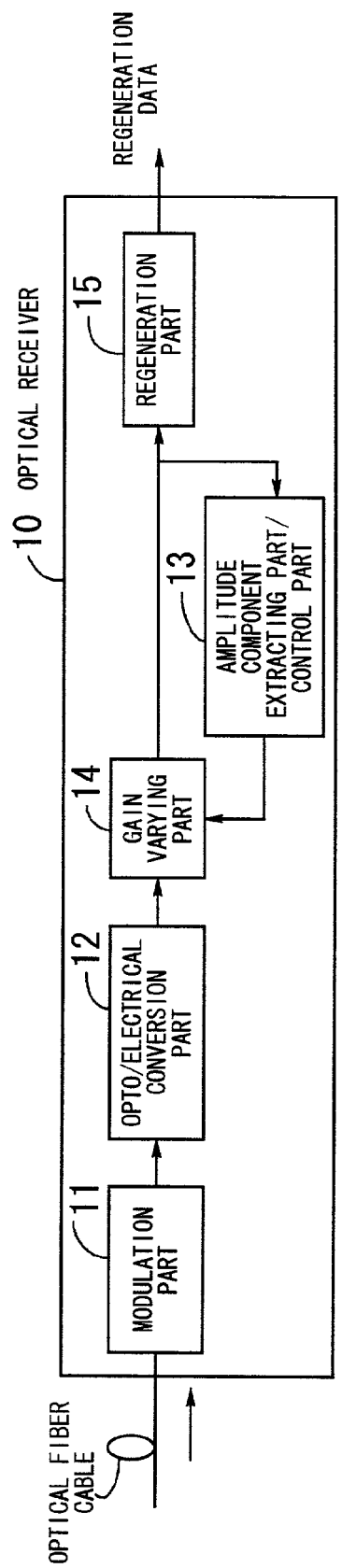
FIG. 1 is a block diagram illustrating the principles of a light receiver according to the present invention.

Embodiments of the present invention are now described with reference to the accompanying drawings. FIG. 1 shows the principles of the optical receiver according to the present invention. An optical receiver 10 is installed in, for example, a ground receiving station in a submarine optical communication system.

A modulation part 11 modulates the amplitude of a received light signal. An opto-electric conversion part 12 converts the output signal of the modulation part 11 into an electric signal. A gain varying part 14 amplitudes the electric signal.

A control part (hereinafter referred to as an amplitude component extraction part/control part) 13 controls the gain of the gain varying part 14 so that a variation width of the envelope line of the amplified signal becomes close to a given value. A regeneration part 15 compares the signal after the amplification with a reference level in order to makes a decision on the signal.

Now, the problems to be solved by the present invention are described. First, an eye pattern is described. When the received signal waveform is visually observed, a signal in which "1" and "0" appear successively is sent from the sending side, and the waveform of the received signal is observed in synchronism with a clock by means of an oscilloscope on which an eye pattern thereof appears.

Figure 2:
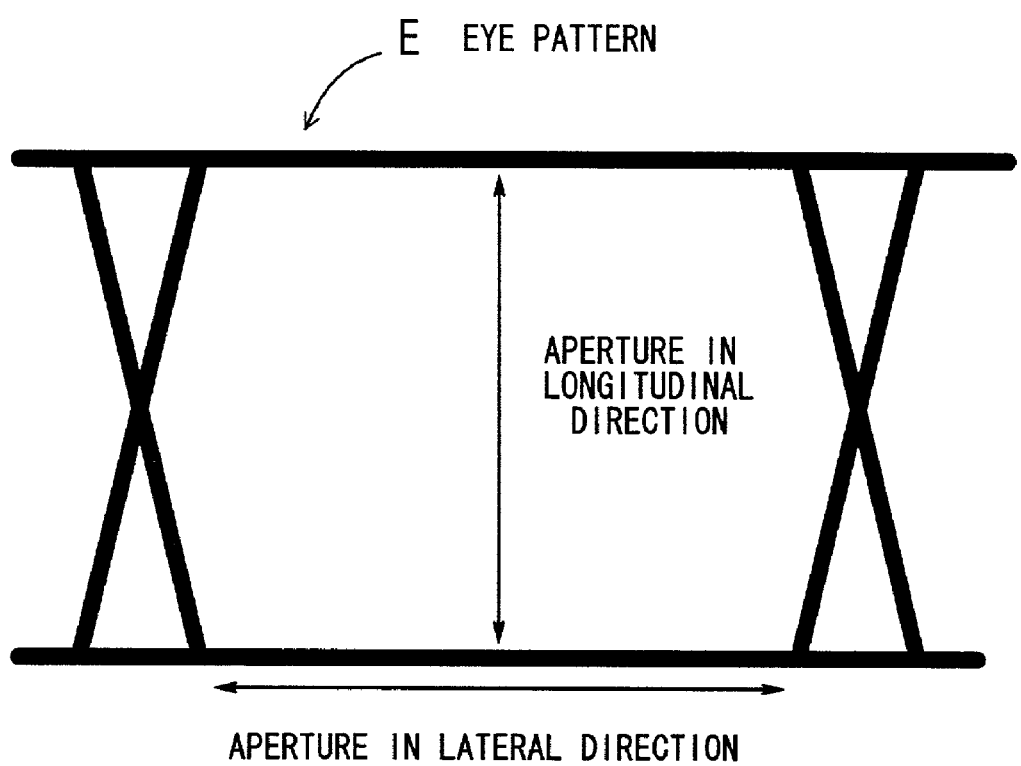
FIG. 2 is a view of an eye pattern.

FIG. 2 shows an eye pattern. An eye pattern E (which is named "eye" because a pattern has a shape of an eye) has a larger noise margin and a timing margin as the aperture in the longitudinal direction is larger. Thus, the margin for "0", "1" decision making is larger as the aperture is larger. In contrast, if the eye pattern is narrow because of noise resulting from degradation of the receiving condition, a regeneration error will arise from difficulty in making a decision as to whether the signal is "1" or "0".

Figure 3:
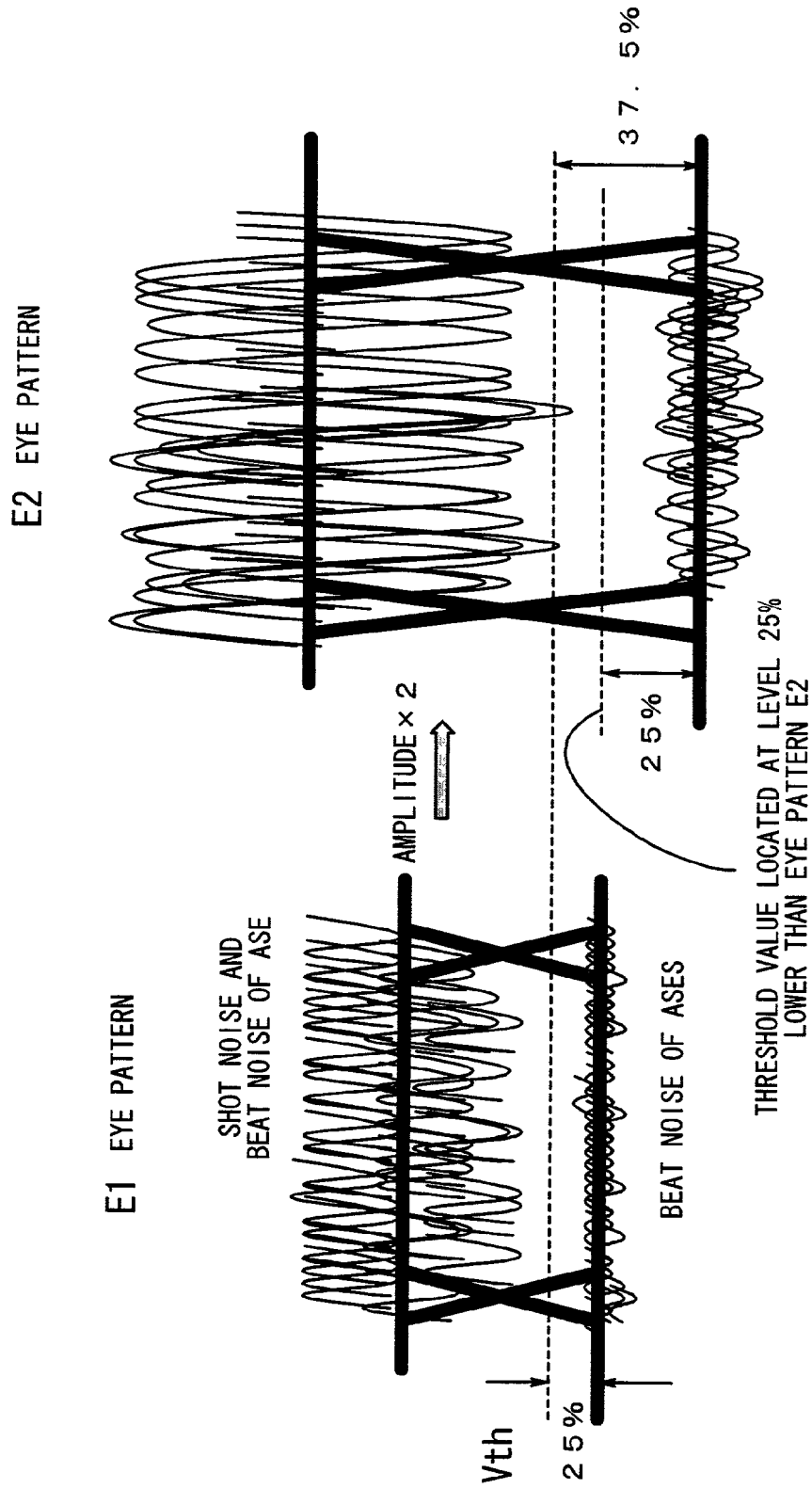
FIG. 3 is a view illustrating problems to be solved by the present invention.

FIG. 3 is a view showing problems to be solved by the present invention. A light signal that travels a long distance and is amplified by an optical amplifier in a repeater includes ASE (Amplified Spontaneous Emission) having a wide spectrum width. ASE is a naturally emitted light that occurs even when no signal is applied to the optical amplifier. The ASE is noise amplified by the amplifier itself.

A shot noise occurs when the light receiving element in the optical amplifier receives the light. The shot noise arises from a time fluctuation of the input light signal, and degrades the optical fiber communication.

In FIG. 3, a beat noise (mutual interference) composed of a shot noise and ASE is imposed on the "H" side of the signal, a beat noise composed of ASEs is imposed on the "L" side thereof. Thus, noise on the "H" side is greater than that on the "L" side. It is thus preferable to set a threshold value Vth for data regeneration at a level that is, for example, approximately 25% lower than the signal amplitude.

That is, since noise is imposed on the signal, the center of the blank part of the eye pattern E1 is 25% lower than the signal amplitude at which the threshold value Vth for making a "0"/"1" decision is set.

A case is considered where an amplitude variation results from the temperature variation characteristic of each element in the receiver. For example, the amplitude of the received signal becomes twice (noise becomes twice). Then, as shown in FIG. 3, the threshold value Vth that is originally at 25% of the signal amplitude shifts to a level corresponding to 37.5% of the signal amplitude.

Even for an eye pattern E2 corresponding to twice the signal amplitude of the eye pattern E1, the level that is originally 25% lower than the signal amplifier is supposed to be the optimal level for decision making. However, the threshold level Vth is maintained at the fixed level originally set for the eye pattern E1 irrespective of variation of the signal amplitude. Viewed from the waveform from the amplitude variation, the optimal levels of the threshold value Vth are different from the respective amplitudes.

In the case shown in FIG. 3, the threshold level Vth shifts to the 37.5% lower level from the 25% lower level with respect to the eye pattern E2 having the twice amplitude, and becomes close to the "H" side. Thus, the decision making will be affected by noise on the "H" side. When the regeneration is performed with the eye pattern E2, there is a high possibility that regeneration error may occur and the transfer quality may be degraded.

The present invention controls the signal amplitude to the constant level for regeneration in order to prevent the threshold level from varying because of variation of the signal amplitude.

Figure 4:
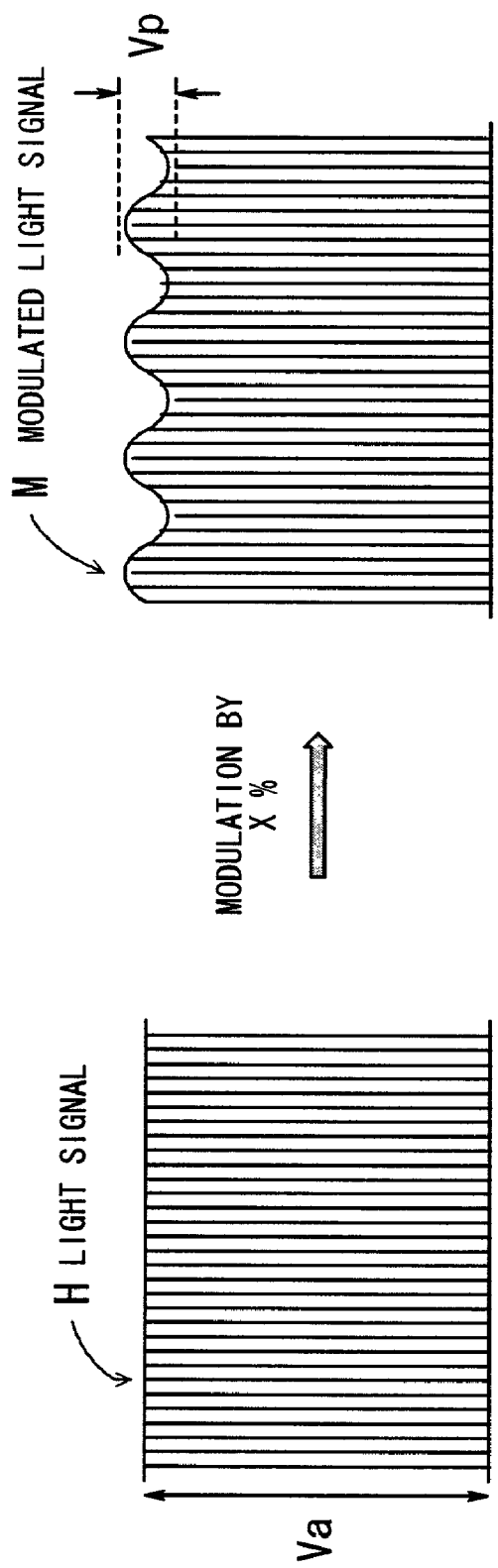
FIG. 4 is a view of a modulation.

A description is now given of an operation of the optical receiver 10 from modulation of the optical signal to amplitude fixing. FIG. 4 shows a modulation. The modulation part 11 modules the received light signal.

In FIG. 4, a modulated light signal M is generated from a light signal H with an amplitude Va so that the variation width of the envelope line is equal to Vp by amplitude modulation. That is, Vp and Va have the following relation:

$$Vp = Va \times (x/100) \qquad (1)$$

where x denotes the modulation factor.

The modulated light signal M is converted into an electric signal by the opto-electric conversion part 12. The amplitude of the electric signal at that time is not constant but varies as described above. The amplitude component extracting part (modulation signal detecting part)/control part 13 detects a variation width Vp1 of the envelope line of the electric signal having the varying amplitude. Then, the signal amplitude is controlled so that Vp1 becomes equal to the reference voltage Vs.

Since the modulation factor is set equal to x %, the reference voltage Vs is expressed as follows when the signal amplitude needed in the regeneration part 15 is Vb (when the signal amplitude input to the regeneration part 15 is Vb):

$$Vs = Vb \times (x/100) \qquad (2)$$

Figure 5:
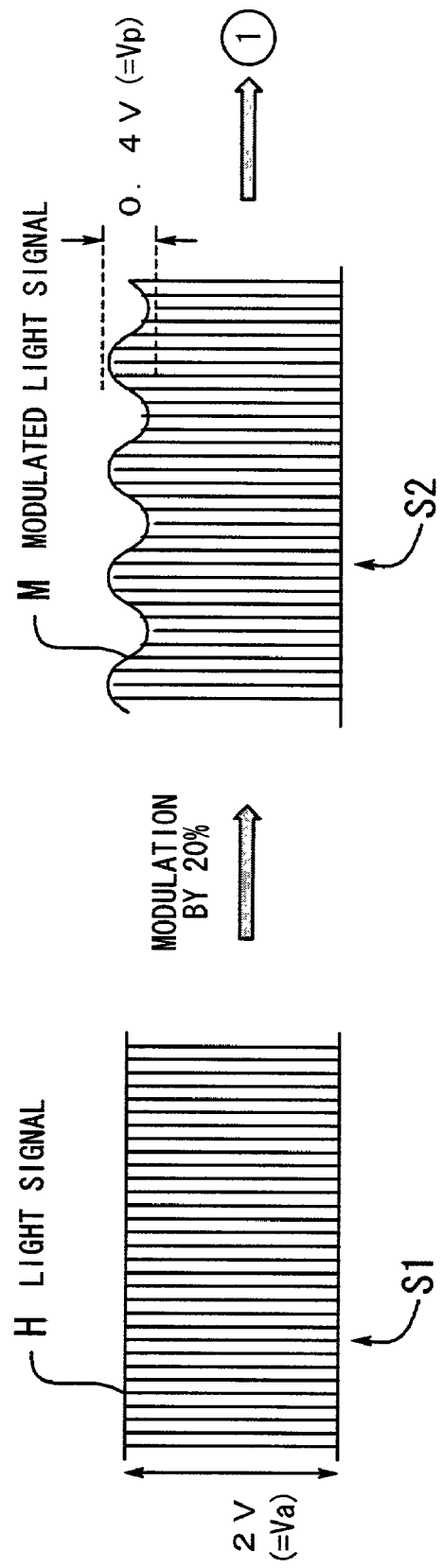
FIG. 5 is a view of a flow from modulation to amplitude fixing.
Figure 6:
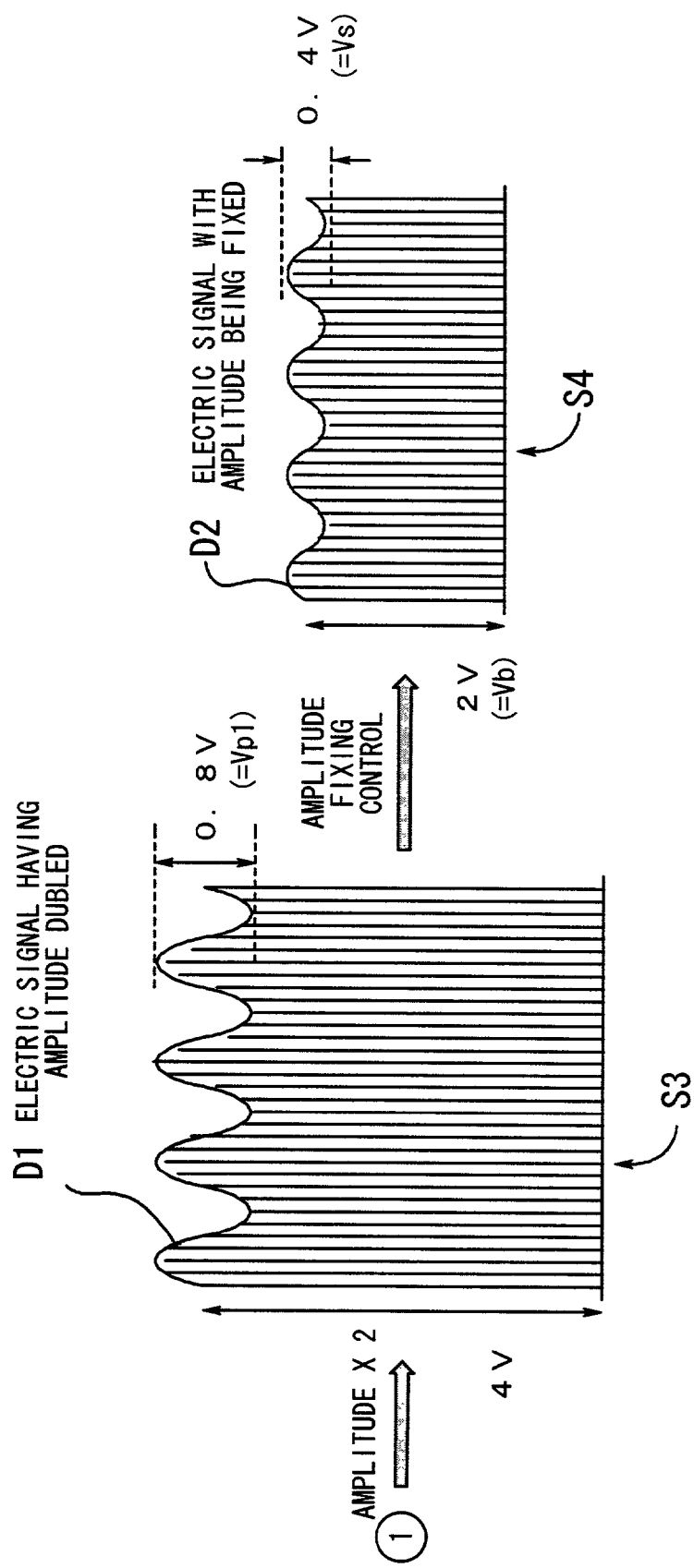
FIG. 6 is a view of a flow from modulation to amplitude fixing.

A description is given of the amplitude fixing using practical numeral values. FIGS. 5 and 6 show a flow from modulation to the amplitude fixing.

At step S1, the modulation part 11 receives the light signal H having an amplitude Va equal to, for example 2V.

At step S2, the modulation part 11 modulates the amplitude by 20% and outputs the modulated light signal M. Vp is equal to 0.4 V (=2×20/100) from equation (1).

At step S3, the modulated light signal M is converted into an electric signal by the opto-electric conversion. It is supposed that the amplitude is twice by the gain varying part 14. Thus, the amplitude of an electric signal D1 is equal to 4 V, and the variation width of the envelope line is equal to 0.8 V. The amplitude component extracting part/control part 13 detects the variation width of the envelope line of the electric signal D1 as 0.8 V(=Vp).

At step S4, the amplitude component extracting part/control part 13 controls the gain of the gain varying part 14 so that the detected variation width of 0.8 V (=Vp1) becomes equal to the reference voltage Vs. That is, when a threshold voltage optimal to a case where the amplitude of the input signal to the regeneration part 15 is equal to 3 V (=Vb) is set (a voltage value close to a level that is 25% lower than the amplitude of the input signal is set), the amplitude component extracting part/control part 13 sets the reference voltage Vs equal to 0.75 V (=3×25/100 (equation (2))), and controls the gain varying part 14 so that the gain is decreased so that the amplitude width of the detected peak value changes 0.75 V from 0.8 V. That is, when the variation width detected by the amplitude component extracting part/control part 13 is higher than the reference value (0.75 V), the gain varying part 14 is controlled so that the gain decreases. If the variation width detected by the amplitude component extracting part/control part 13 is lower than the reference value (0.75 V), the gain of the gain varying part 14 will be controlled to increase.

As described above, according to the present invention, the electric signal having the constant amplitude on an average is applied to the regeneration part 15 as the target signal to be compared with the given threshold level (Vth). Thus, the fixed threshold value Vth is kept optimal and correct data regeneration can be realized.

Figure 7:
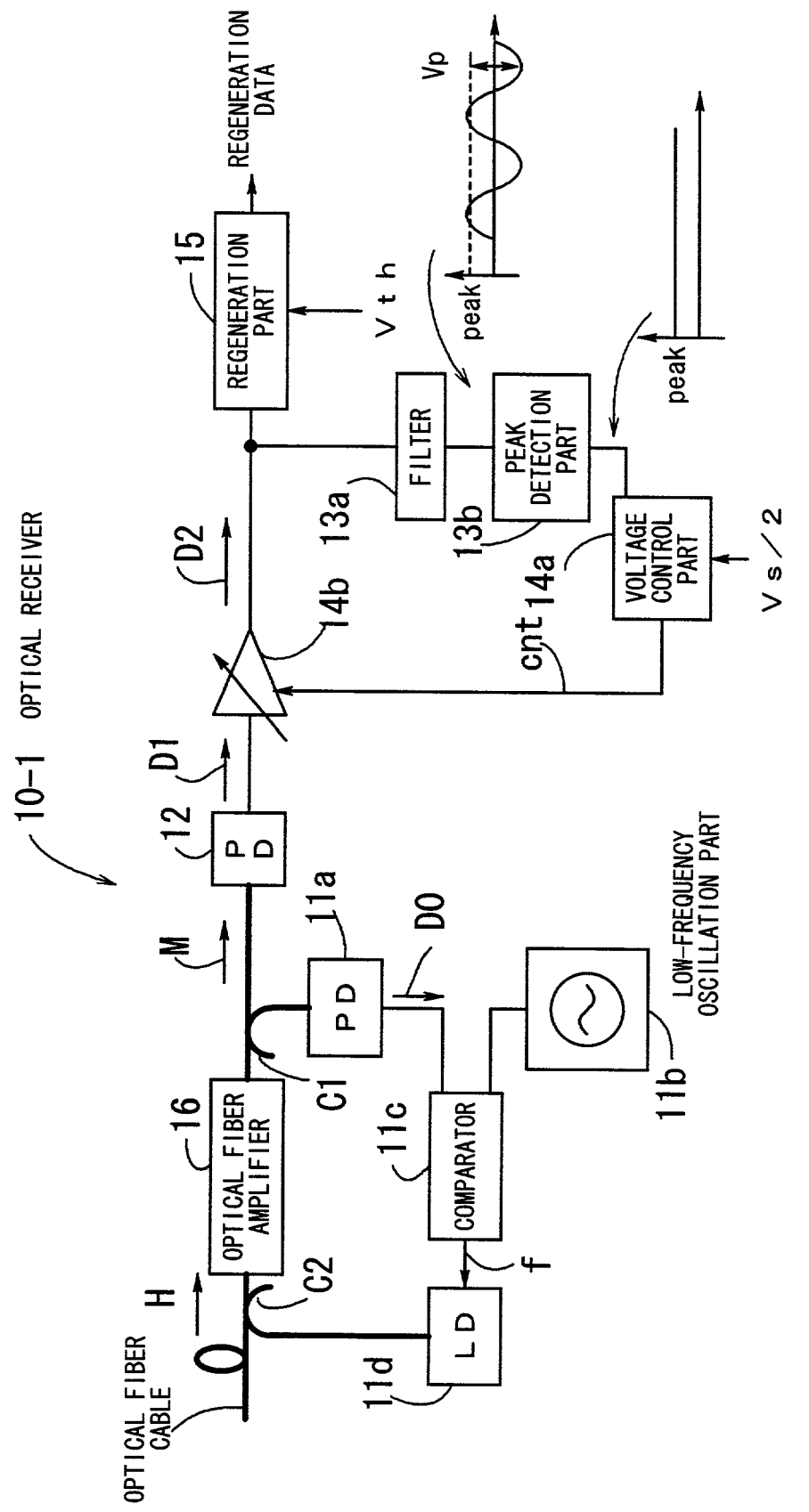
FIG. 7 is a diagram of a structure of a first embodiment of the present invention.

A structure of the optical receiver 10 is now described. FIG. 7 shows a structure of the optical receiver according to the first embodiment of the present invention. An optical receiver 10-1 includes an optical fiber amplifier 16 amplifying the light signal from an optical fiber cable, a photodiode 12(corresponding to the opto-electric conversion part 12) converting the amplified light signal into an electric signal, and the regeneration part 15 retrieving original data from the electric signal.

The functions of the modulation part 11 are implemented by couplers C1 and C2, a photodiode (hereinafter simply referred to as PD) 11a, a low-frequency oscillator part 11b, a comparator (for example, a differential amplifier) 11c, and a laser diode (hereinafter simply referred to as LD) 11d. The functions of the amplitude component detecting part/control part 13 are implemented by a filter 13a and a peak detection part 13b. A voltage control part 14a and a gain control amplifier 14b correspond to the gain varying part 14. A variable transformer impedance amplifier (which will be described later with reference to FIG. 14) may be substituted for the gain control amplifier.

In operation, the optical fiber amplifier 16 receives and amplifies the light signal H transferred over the optical fiber cable. The optical fiber amplifier 16 uses an optical fiber as an amplifying medium, and is, for example, an erbium doped optical fiber.

The PD 11a converts the amplified light signal that is branched by the coupler C1 into an electric signal based on the power of the light signal. The low-frequency oscillator part 11b oscillates a low-frequency wave having a fixed amplitude (the frequency is equal to, for example, 100 kHz) The comparator 11c outputs a control signal f that depends on the difference between the electric signal D0 and the low-frequency oscillator 11b.

The LD 11d controls emission of a pump light by using the control signal f as a drive signal. The amplitude-modulated pump light is applied to the optical fiber cable via the coupler C2. The light signal M that has been amplitude-modulated is output from the optical fiber amplifier 16 by the amplitude-modulated pump light.

The PD 12 converts the light signal M into the electric signal D1 by the opto-electric conversion. At this time, the electric signal D1 is varying because of the temperature variation characteristic of each element.

The filter (band-pass filter) 13a has a pass band in which the output frequency (here 100 kHz) of the low-frequency oscillator 11b, and outputs the filtered signal. The peak detection part 13b detects the peak value of the filtered signal. The voltage control part 14a compares the peak value with Vs/2 (which is preferably adjusted taking into account the waveform of the filtered output), and sends it a control signal cnt to the gain control amplifier 14b so that the difference becomes zero. If the peak value is higher than Vs/2, the gain of the amplifier 14b is decreased. In contrast, if the peak value is lower than Vs/2, the gain is increased.

The gain control amplifier 14b controls the gain of the electric signal D1 in response to the control signal cnt, and thus generates an amplitude-fixed electric signal D2 The regeneration part 15 regenerates the original data from the electric signal D2 with its amplitude being fixed on an average.

Figure 8:
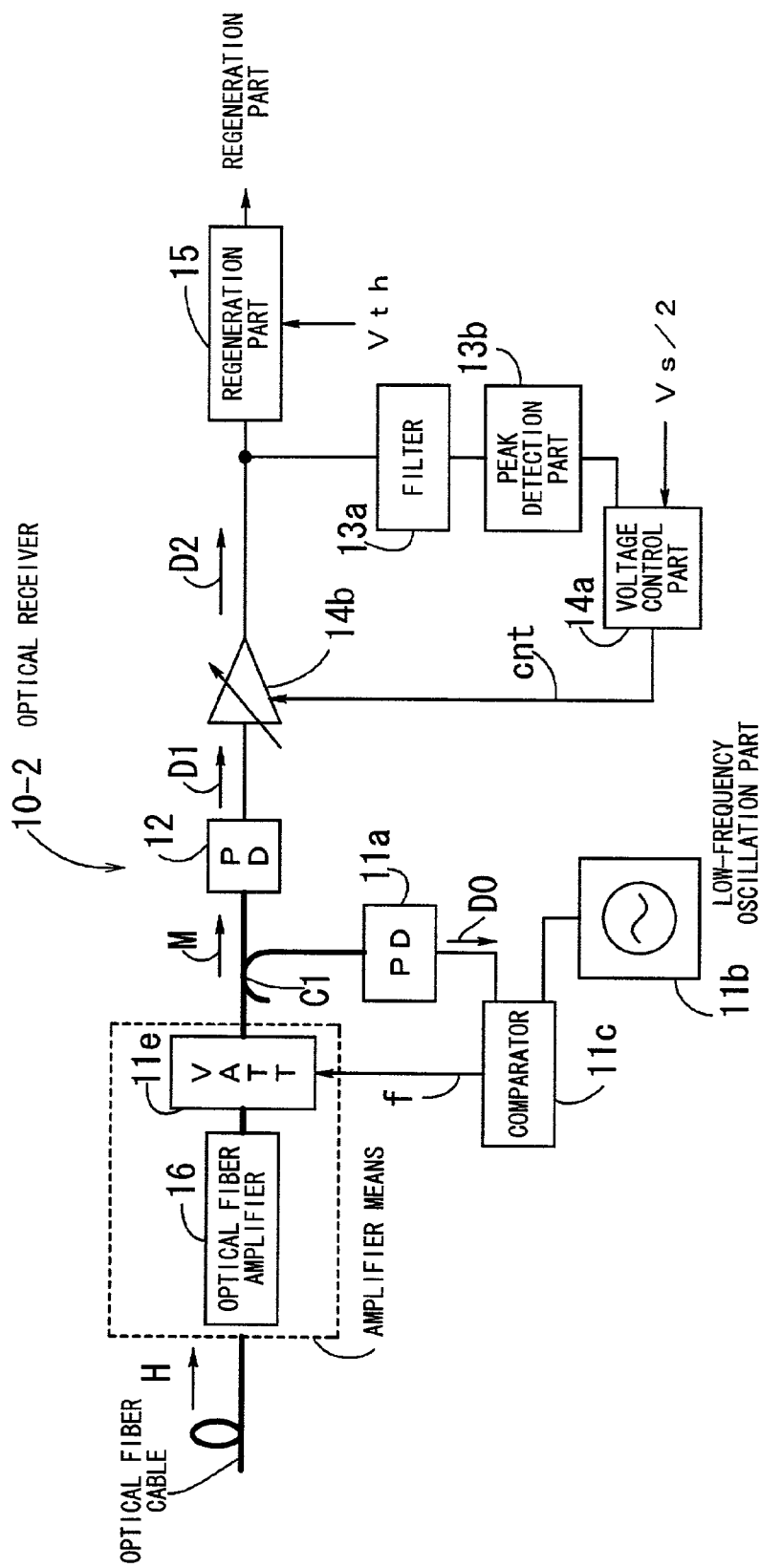
FIG. 8 is a diagram of a structure of a second embodiment of the present invention.

FIG. 8 shows a structure of the optical amplifier according to the second embodiment of the present invention. An optical amplifier 10-2 includes an optical variable attenuator 11e, the coupler C1, PD 11a, low-frequency oscillator part 11b, and comparator 11c in order to implement the functions of the modulation part 11.

The optical fiber amplifier 16 receives and amplifies the light signal H transmitted from the optical fiber cable. The PD 11a converts the light signal that is branched by he coupler C1 into the electric signal D0. The low-frequency oscillator part 11b oscillates a low frequency.

The comparator 11c outputs the signal f dependent on the difference between the electric signal D0 and the low-frequency signal from the low-frequency oscillator 11b. The optical variable attenuator 11e adjusts the quantity of attenuation of the input light signal using the signal f as an attenuation adjustment signal. The light signal M is then output from the optical variable attenuator 11e.

Figure 9:
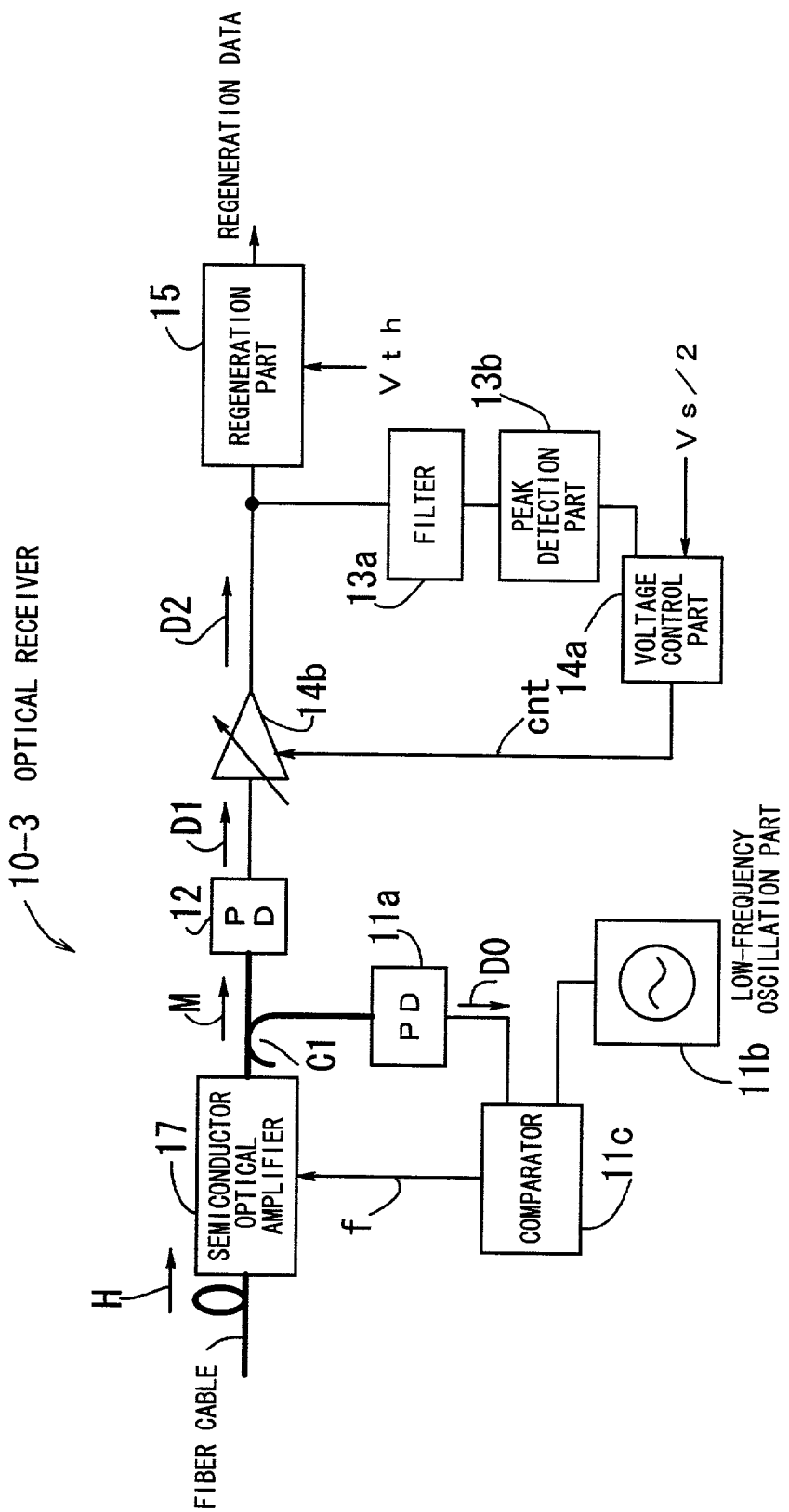
FIG. 9 is a diagram of a structure of a third embodiment of the present invention.

FIG. 9 shows a structure of the optical receiver according to the third embodiment of the present invention. An optical receiver 10-3 includes a semiconductor optical amplifier 17 substituted for the optical fiber amplifier 16. The other structural parts of the optical receiver 10-3 are the same as shown in FIG. 8.

The semiconductor optical amplifier 17 receives and amplifies the light signal H transmitted from the optical fiber cable. The semiconductor optical amplifier 17 uses a semiconductor laser as an amplifying medium, and is, for example, of Fabry-Perot type or distributed feedback (DFB) type.

The PD 11a converts the light signal that is amplified and branched by the coupler C1 into the electric signal D0. The low-frequency oscillator part 11b oscillates a low frequency. The comparator 11c outputs the signal f dependent on the difference between the electric signal D0 and the low-frequency signal from the low-frequency oscillator part 11b. The semiconductor optical amplifier 17 generates the light signal M from the amplified light signal by using the signal f as the drive signal. The operation that follows the above is the same as that in the first embodiment of the present invention, and a description thereof will be omitted here.

Figure 10:
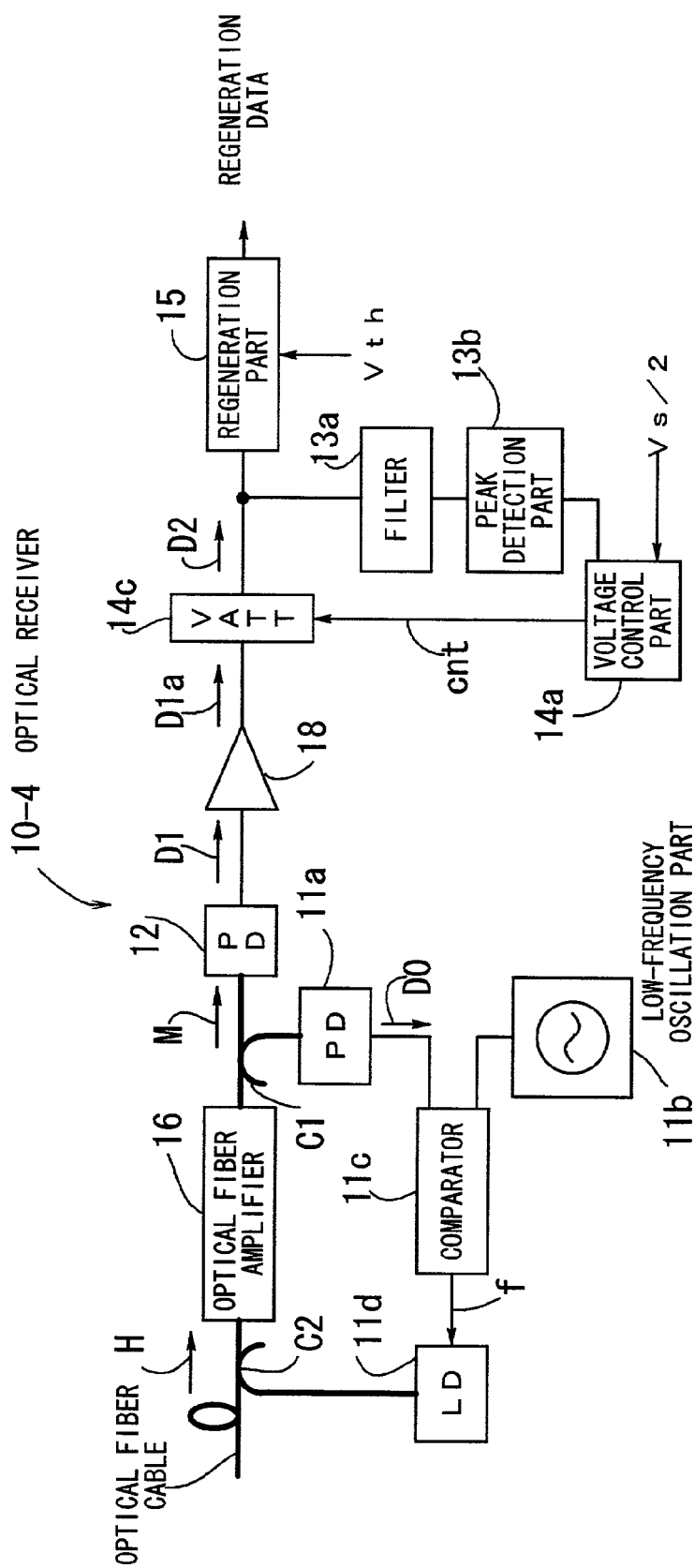
FIG. 10 is a diagram of a structure of a fourth embodiment of the present invention.

FIG. 10 shows a structure of the optical receiver according to the fourth embodiment of the present invention. An optical receiver 10-4 includes, as means for implementing the functions of the gain varying part 14, the voltage control part 14a, and an electrically variable attenuator 14c. An amplifier 18 is provided between the PD 12 and the electrically variable attenuator 14c. The other structure components are the same as shown in FIG. 7.

In operation (the operation of the stages followed by PD 12 are the same as those of the first embodiment of the present invention and a description thereof will be omitted), the PD 12 converts the modulated light signal M into the electric signal D1 by the opto-electric conversion. The amplifier 18 amplifies the electric signal D1, and thus outputs an electric signal D1a, the amplitude of which is varying.

The filter 13a extracts the signal in the given band. The peak detection part 13b detects the peak value of the extracted signal. The voltage control part 14a compares the peak value with the reference voltage Vs, and sends the control signal cnt to the electrically variable attenuator 14c so that the difference becomes zero.

The electrically variable attenuator 14c adjusts the quantity of attenuation of the received electric signal D1a on the basis of the control signal cnt so that the amplified is fixed (without variation because of modulation), and generates the electric signal D2. Then, the regeneration part 15 regenerates the original data from the electric signal D2 by using the threshold value Vth.

Figure 11:
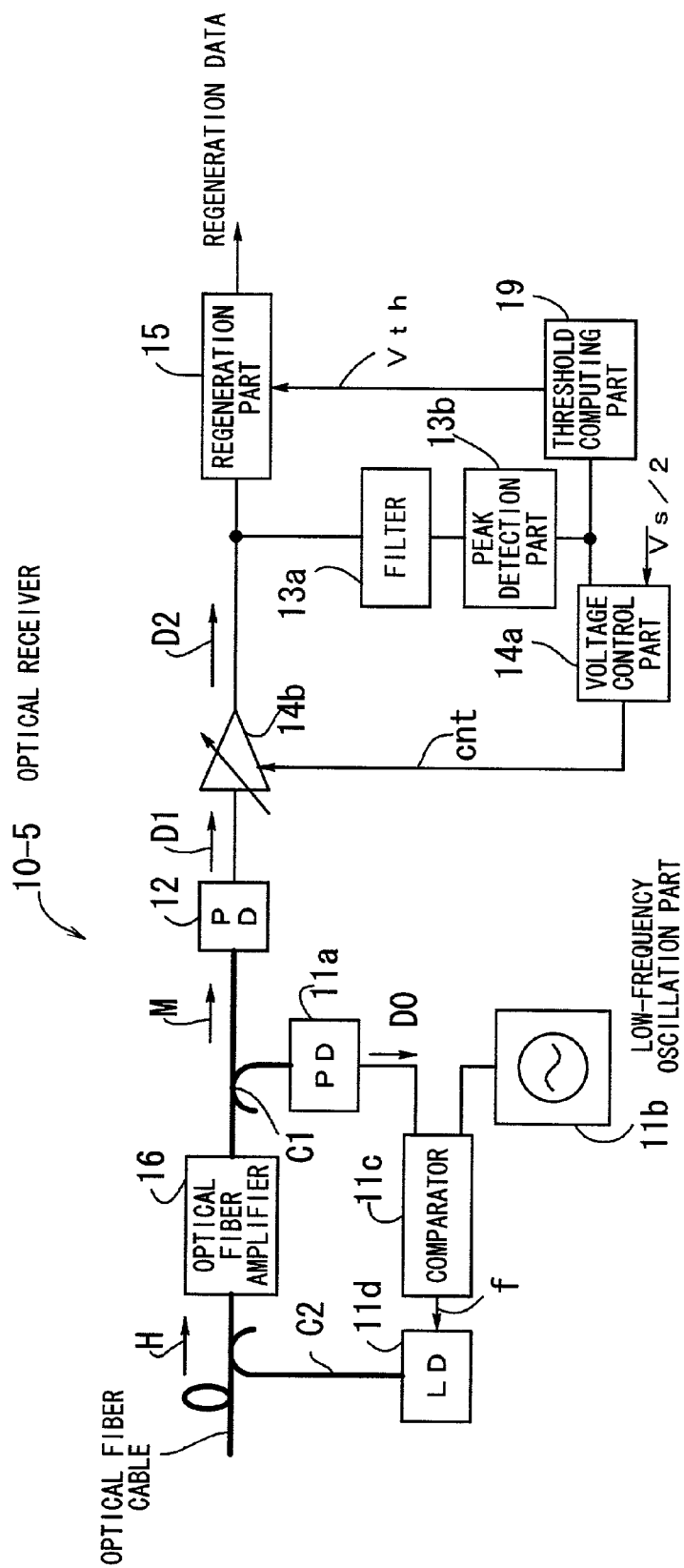
FIG. 11 is a diagram of a structure of a fifth embodiment of the present invention.

FIG. 11 shows a structure of the optical receiver according to the fifth embodiment of the present invention. An optical receiver 10-5 includes a threshold computing part 19, which receives the peak value (=Vp1) output from the peak detection part 13b, and computes the threshold value Vth therefrom. The other components are the same as shown in FIG. 7. The operations other than the operation in which the threshold computing part 19 autonomously computes the threshold value are the same as those of the first embodiment of the present invention, and a description thereof will be omitted.

The threshold computing part 19 receives the peak value and obtain the amplitude Vr of the electric signal D1 in which its amplitude is varying from expression (3) described below:

$$Vr = 100 \cdot Vp1/x \quad (3)$$

where it is assumed that a modulation of x % is applied so as to have the variation width of the envelope line equal to Vp.

For example, when the above is applied to step S3 shown in FIG. 6, then Vr is 4 V, Vp1 is 0.8 V and x is 20. Assuming that the optimal threshold value is 25% of the input signal applied to the regeneration part 15, the threshold value Vth located at a level that is 25% lower than the amplitude of the electric signal D1 that is varying can be obtained by expression (4) shown below;

$$Vth=Vr\times(25/100) \quad (4)$$

As described above, the threshold computing part 19 computes the threshold value using expressions (3) and (4) to thereby obtain the threshold value Vth, which is set in the reproduction part 15. By the above control, the optical threshold value can be dynamically set to flexibly follow the varying amplitude before amplitude fixing.

Figure 12:
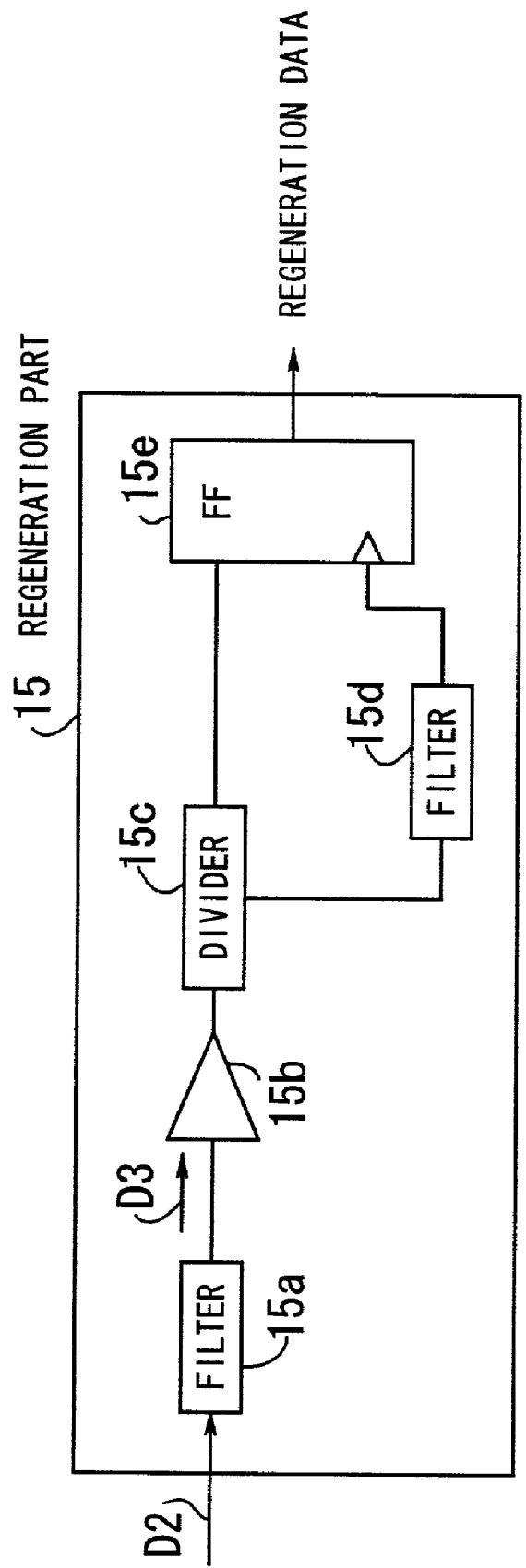
FIG. 12 is a diagram of a structure of a regeneration part.

A description will now be given of structures of the regeneration part 15, the peak detection part 13b and the variable transformer impedance amplifier. FIG. 12 shows a structure of the regeneration part 15. The regeneration part 15 is made up of a filter 15a, an amplifier 15b, a divider 15c, a filter 15d and a flip-flop 15e.

The filter 15a receives the electric signal D2 and cuts off the modulation components of low frequencies, a resultant main signal D3 being generated. Thus, in this case, the amplitude is further fixed to the constant level. The amplifier 15b amplifies the main signal D3. The divider 15c branches the main signal D3 into two. The filter 15d is a band-pass filter having a narrow band (a dielectric filter is widely used), and a clock timing from the main signal D3. The flip-flop 15e makes a "1"/"0" decision on the main signal D3 at the clock timing extracted, and outputs regenerated data.

Figure 13:
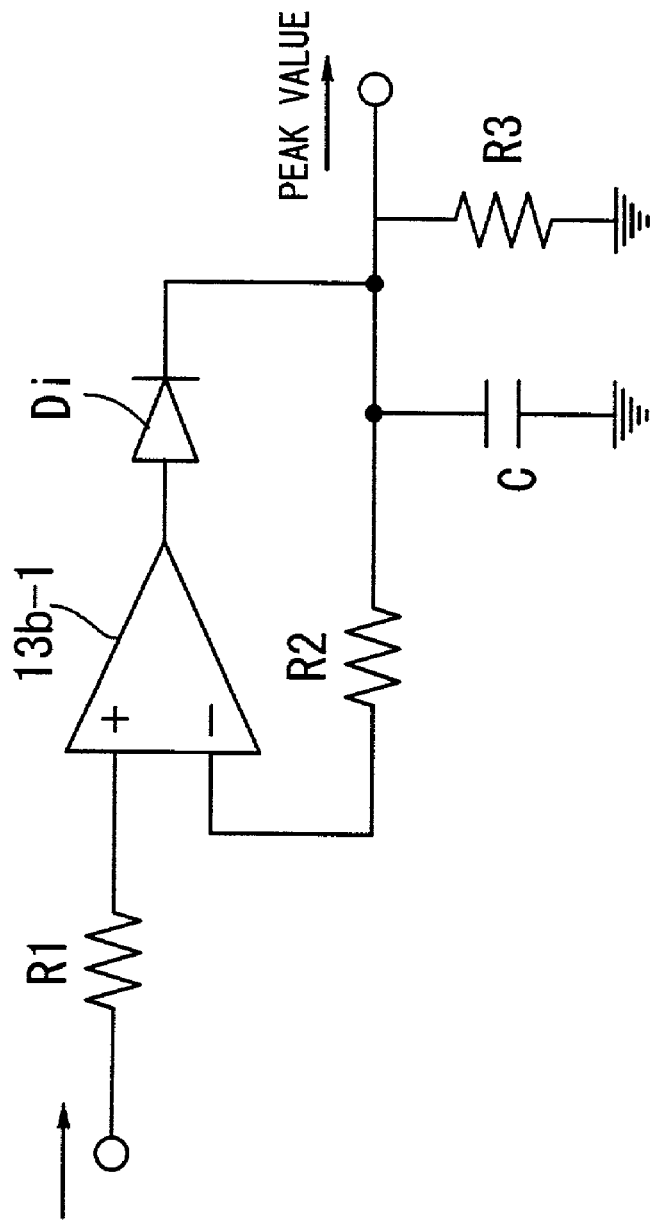
FIG. 13 is a diagram of a structure of a peak detection part.

FIG. 13 shows a structure of the peak detection part 13b. An end of a resistor R1 is connected to an output terminal of the filter 13e, and the other end of the resistor R1 is connected to the (+) input terminal of a difference amplifier 13b-1.

An end of resistor R2 is connected to the (−) input terminal of the difference amplifier 13b-1, and the other end thereof is connected to the cathode of a diode D1, an end of a capacitor C and an end of a resistor R3. The resistor R2 detects the peak value. The anode of the diode Di is connected to the output terminal of the difference amplifier 13b-1, and the other ends of the capacitor C and the resistor R3 are connected to ground GND.

Figure 14:
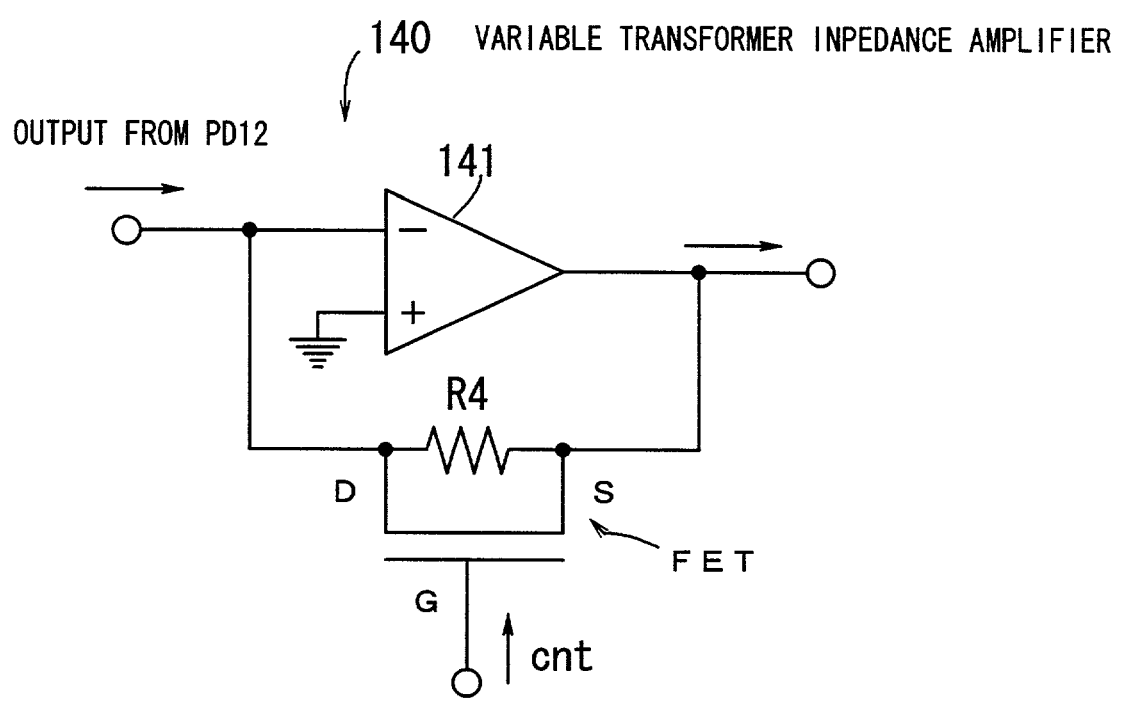
FIG. 14 is a diagram of a structure of a variable transformer impedance amplifier.
Figure 15:
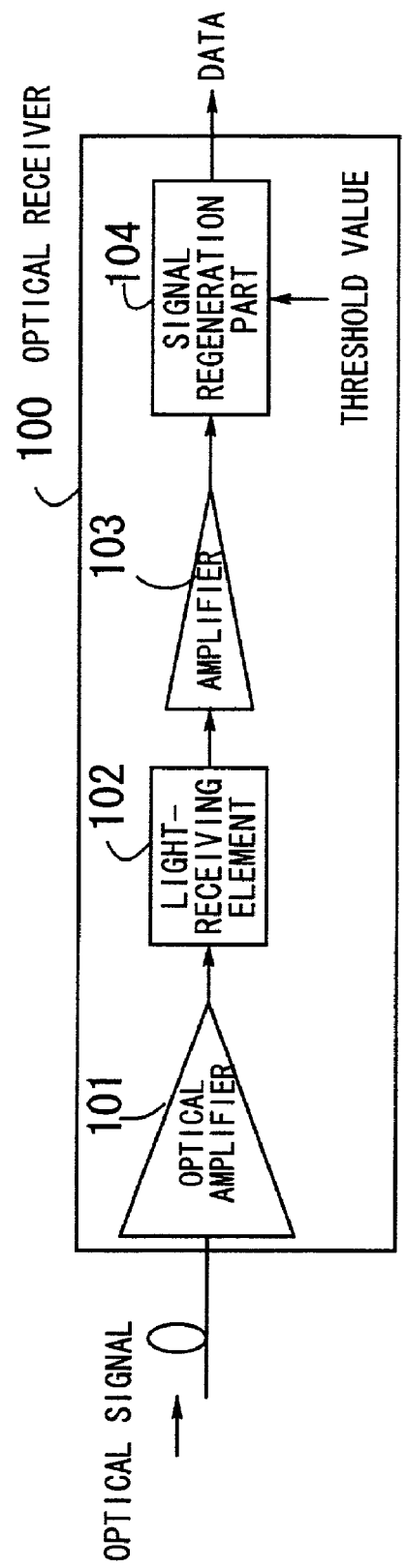
FIG. 15 is a diagram of a primary structure of a light receiving part.

FIG. 14 shows a structure of the variable transformer impedance amplifier. A variable transformer impedance amplifier 140 is a feedback amplifier in which a current input can be converted into a voltage output, and is widely used as an amplifier for amplifying the signal (current) from the PD.

The (−) input terminal of a difference amplifier 141 is connected to the output part of the PD 12, an end of a resistor R4, and drain D of an FET (Field Effect Transistor), and the (+) input terminal thereof is grounded.

The output terminal of the difference amplifier 141 is connected to the other terminal of the resistor R4, source S of the FET and the input part of the regeneration part 15. The difference amplifier 141 results in the electric signal D2. The gate G of the FET is connected to the output part of the voltage control part 14a, to which the control signal cnt is applied.

As described above, the optical amplifier 10 of the present invention converts the light signal into the electric signal after the light signal is modulated, controls the signal amplitude so that the varying amplitude of the modulated component of the electric signal becomes equal to the reference voltage, and controls the signal amplitude to fall in the given range so that the threshold value is set at the level at which error occurs with the least possibility within the effective range of the eye pattern.

Therefore, the amplitude of the signal applied to the regeneration part 15 has a stabilized value which has no variation on an average. It is thus possible to make data decision with high precision and to improve the quality of the signal regeneration control and reliability.

As described above, the optical receiver of the present invention controls the gain of the gain varying part so that the variation width of the envelope line of the signal after amplification becomes close to the given value, and compares it with the given threshold level at the regeneration part for signal decision. Thus, the average of the amplitude of the input signal applied to the regeneration part is fixed. Even when the threshold value used for signal decision at the regeneration part is used at the fixed level, the quality of the signal regeneration control and the reliability can be improved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An optical receiver comprising:
   a modulation part modulating a light signal received;
   an opto-electric conversion part converting an output signal of the modulation part into an electric signal;
   a gain varying part amplifying the electric signal;
   a control part controlling a gain of the gain varying part so that a variation width of an envelope line of the signal after amplification becomes close to a given value Vs;
   a regeneration part comparing the signal after the amplification with a given threshold level for signal decision; and
   wherein the given value Vs is given by $$Vs=Vb\times(x/100)$$

where Vb is the signal amplitude needed in the regeneration part, and x is a modulation factor by the modulation part.

2. The optical receiver according to claim 1, wherein said control part adjusts a quantity of attenuation of an electrically variable attenuator for gain control.

3. The optical receiver according to claim 1, wherein said control part adjusts a gain of a variable transformer impedance amplifier for gain control.

4. An optical receiver comprising:
   a modulation part modulating an amplitude of a light signal received to thereby vary an envelope line of an output signal after amplitude modulation by a width having a given ratio with an average amplitude of the envelope line of the output signal after the amplitude modulation;
   an opto-electric conversion part converting the output signal into an electric signal;
   a gain varying part varying the electric signal;

a control part controlling a gain of the gain varying part so that the variation width of the envelope line of the signal after the amplification becomes close to a given value Vs;

a regeneration part comparing the signal alter the amplification with a given threshold level for signal decision; and wherein the given value Vs is given by $$Vs = Vb^x(x/100)$$

where Vb is the signal amplitude needed in the regeneration part, and x is a modulation factor by the modulation part.

5. The optical receiver according to claim 4, wherein said modulation part comprises:

amplifying means for amplifying the light signal received;

detection means for detecting power of an output light signal of the amplifying means; and gain control means for controlling the gain of the amplifying means so that the power detected becomes close to the reference signal, a signal having a given amplitude and a given frequency being used as said reference signal.

6. The optical receiver according to claim 4, wherein said modulation part comprises:

amplifying means for amplifying the light signal received;

detection means for detecting power of the light signal output from the amplifying means;

comparing means for comparing the power detected with a reference value to output a signal based on a difference there between; and emitting means for adjusting a pump light applied to said amplifying means by controlling the light output by the output signal of the comparing means so that the power detected becomes close to the reference signal, a signal having a given amplitude and a given frequency being used as said reference signal.

7. An optical receiver comprising:

a modulation part modulating an amplitude of a light signal received to periodically vary an envelope line of an output signal after amplitude modulation by a width having a given ratio with an average amplitude of the envelope line of the output signal after the amplitude modulation;

an opto-electric conversion part converting the output signal into an electric signal;

a gain varying part varying the electric signal;

a band-pass filter having a pass band for a signal of a frequency dependent on a period obtained from the signal after amplification;

a control part controlling a gain of the gain varying part on the basis of an output signal of the band-pass filter so that the variation width of the envelope line of the signal after the amplification becomes close to a given value Vs;

a regeneration part comparing the signal after the amplification with a given threshold level for signal decision; and wherein the given value Vs is given by $$Vs = Vb^x(x/100)$$

where Vb is the signal amplitude needed in the regeneration part, and x is a modulation factor by the modulation part.

8. The optical receiver according to claim 7, wherein said control part controls the gain of the gain varying part so that a peak value of the output signal of the band-pass filter becomes close to a given reference value.

* * * * *